(12) United States Patent
Aoyagi et al.

(10) Patent No.: US 9,818,645 B2
(45) Date of Patent: Nov. 14, 2017

(54) THROUGH ELECTRODE, MANUFACTURING METHOD THEREOF, AND SEMICONDUCTOR DEVICE AND MANUFACTURING METHOD THEREOF

(71) Applicant: National Institute of Advanced Industrial Science and Technology, Tokyo (JP)

(72) Inventors: Masahiro Aoyagi, Tsukuba (JP); Tung Thanh Bui, Tsukuba (JP); Naoya Watanabe, Tsukuba (JP); Katsuya Kikuchi, Tsukuba (JP); Wei Feng, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/251,470

(22) Filed: Aug. 30, 2016

(65) Prior Publication Data
US 2017/0200644 A1    Jul. 13, 2017

(30) Foreign Application Priority Data
Jan. 8, 2016 (JP) ................... 2016-002745

(51) Int. Cl.
*H01L 23/48* (2006.01)
*H01L 21/768* (2006.01)
(Continued)

(52) U.S. Cl.
CPC .. *H01L 21/76895* (2013.01); *H01L 21/76802* (2013.01); *H01L 21/76877* (2013.01);
(Continued)

(58) Field of Classification Search
CPC ............ H01L 23/535; H01L 23/481; H01L 23/53228; H01L 21/76895
(Continued)

(56) References Cited

U.S. PATENT DOCUMENTS 8,823,179 B2 * 9/2014 Tsai ................. H01L 21/76898
257/774
2004/0259292 A1 * 12/2004 Beyne .............. H01L 21/76898
438/125
(Continued)

OTHER PUBLICATIONS

Thompson, Scott E. et al., "Uniaxial-Process-Induced Strained-Si: Extending the CMOS Roadmap," IEEE Transactions on Electron Devices, vol. 53, No. 5, May 2006; pp. 1010-1020.

*Primary Examiner* — Nitin Parekh
(74) *Attorney, Agent, or Firm* — Dentons US LLP; Peter Su

(57) ABSTRACT

Embodiments provided are a through electrode that can be manufactured by a method not including the step of removing a side-wall insulating film formed at the bottom part of the through hole and so having improved electrical characteristics and mechanical reliability and a manufacturing method thereof as well as a semiconductor device and a manufacturing method thereof. A through electrode is disposed in a semiconductor substrate, and includes: a conductive layer; a side-wall insulating film that is disposed between the conductive layer and the semiconductor substrate, the side-wall insulating film being represented by the following chemical formula (1), and a tubular semiconductor layer disposed between the conductive layer and the semiconductor substrate, the semiconductor layer including a same material as the material of the semiconductor substrate.

(Continued)

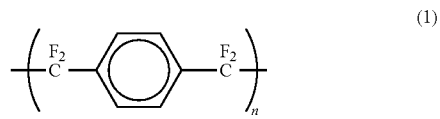

(1)

4 Claims, 20 Drawing Sheets

(51) Int. Cl.
H01L 23/535 (2006.01)
H01L 23/532 (2006.01)
(52) U.S. Cl.
CPC ...... H01L 21/76898 (2013.01); H01L 23/535 (2013.01); H01L 23/53228 (2013.01)
(58) Field of Classification Search
USPC .......................................................... 257/774
See application file for complete search history.

(56) References Cited

U.S. PATENT DOCUMENTS

| | | | | |
|---|---|---|---|---|
| 2010/0187697 A1* | 7/2010 | Tsai | ................. | H01L 21/76898 257/773 |
| 2013/0285256 A1* | 10/2013 | Fischer | ................. | H01L 21/486 257/774 |
| 2015/0214461 A1* | 7/2015 | Kurihara | ................. | H01L 35/32 257/467 |
| 2015/0348873 A1* | 12/2015 | Katkar | ................. | H01L 23/481 257/774 |

* cited by examiner

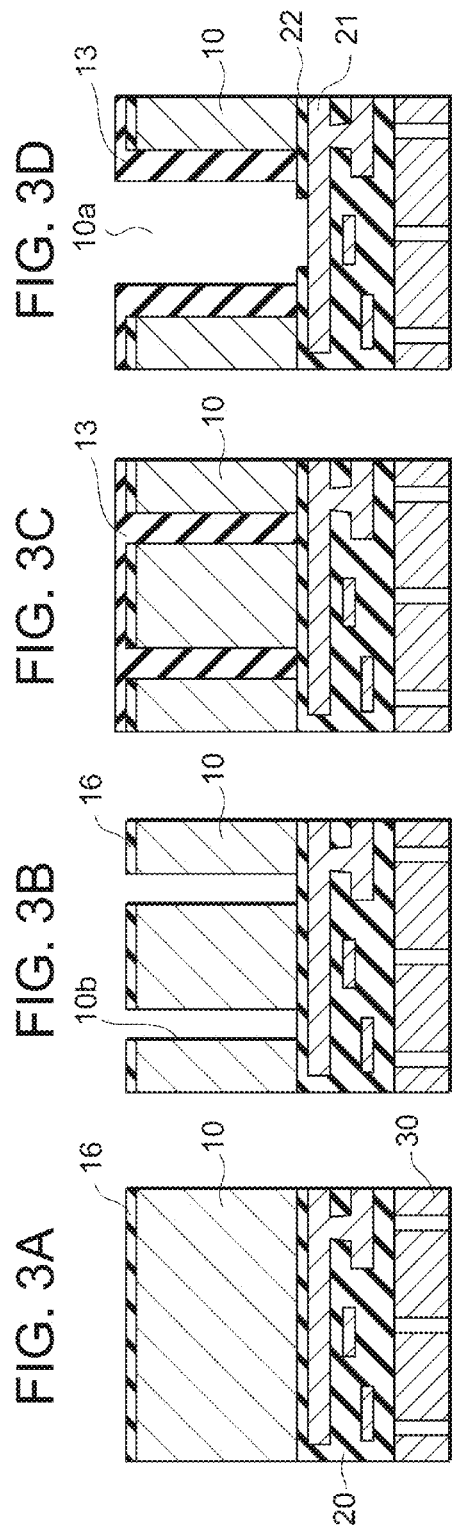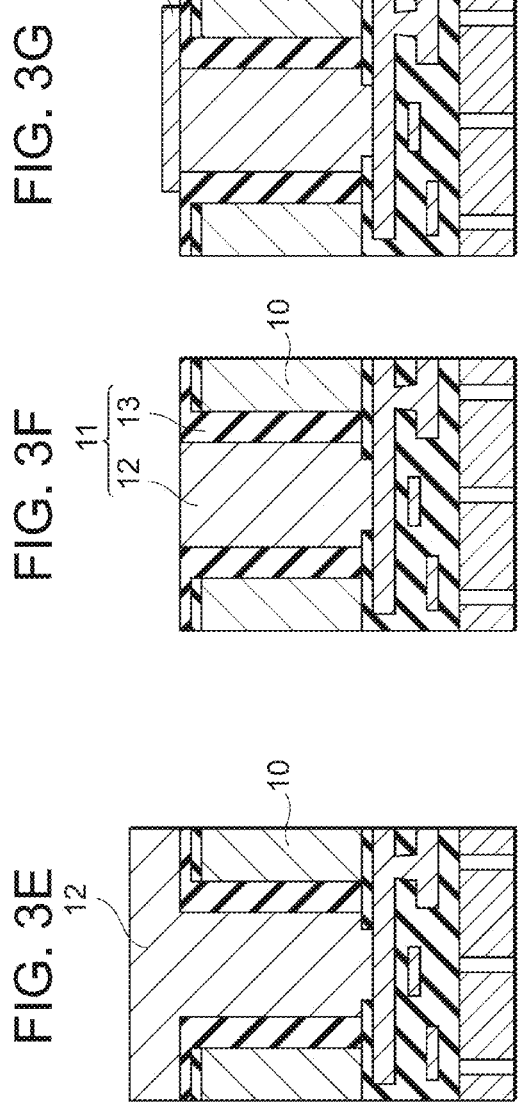

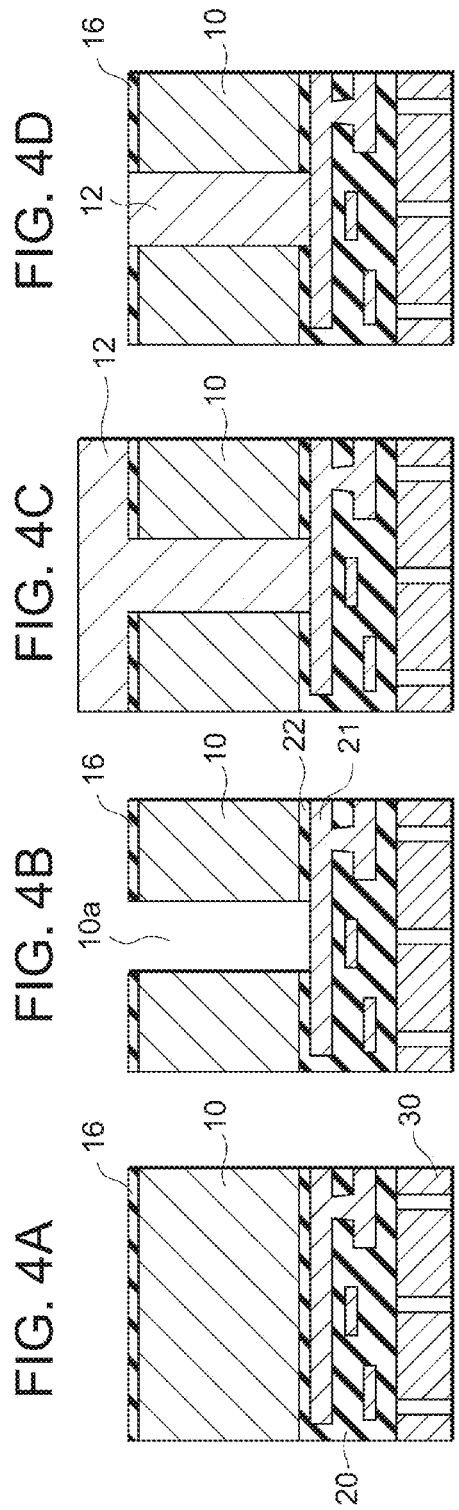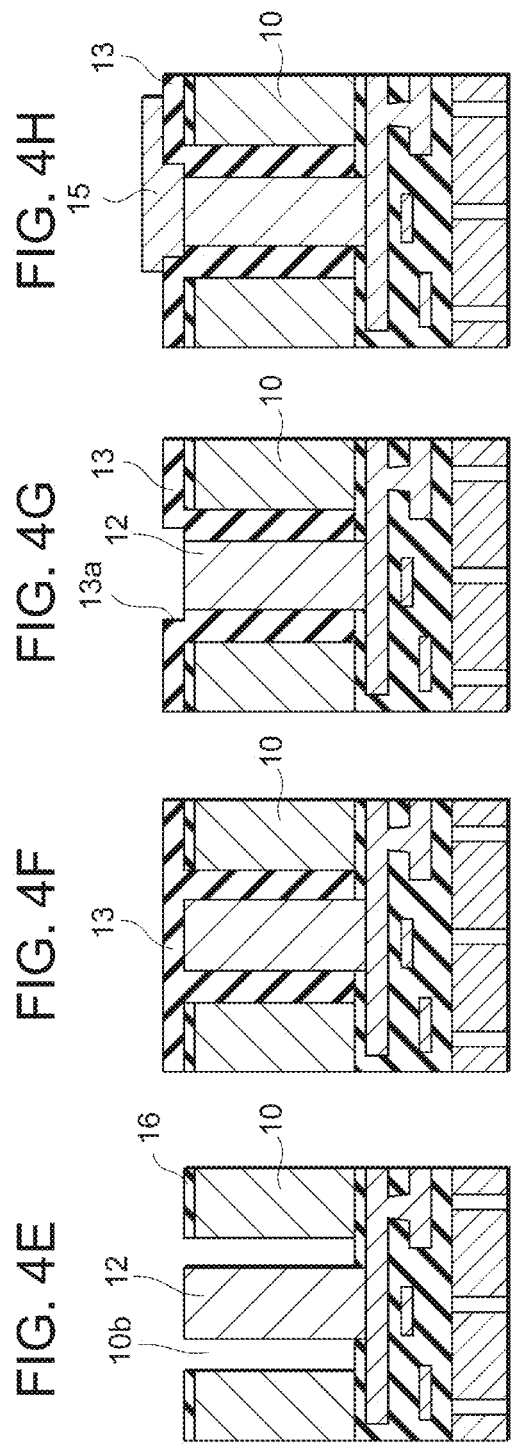

12 14 13
11

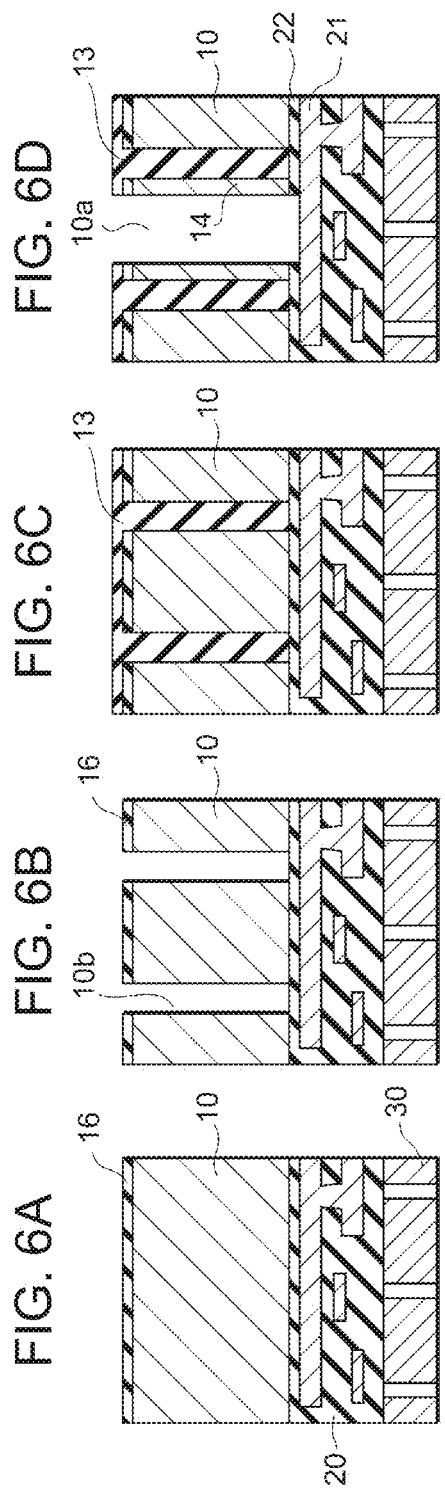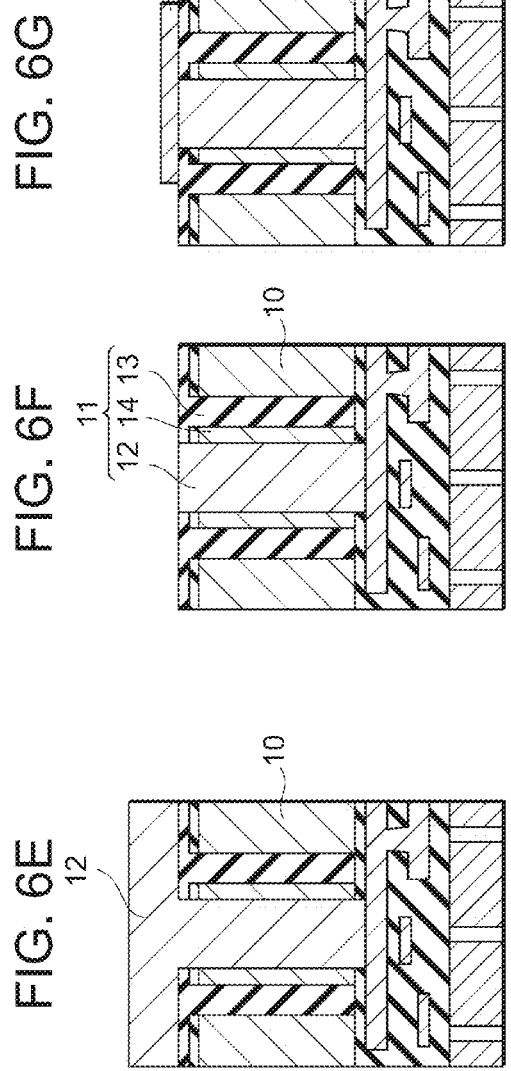

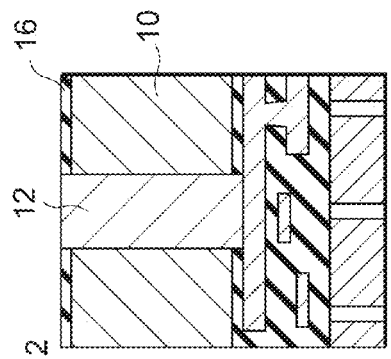
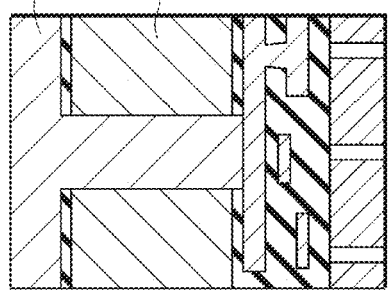
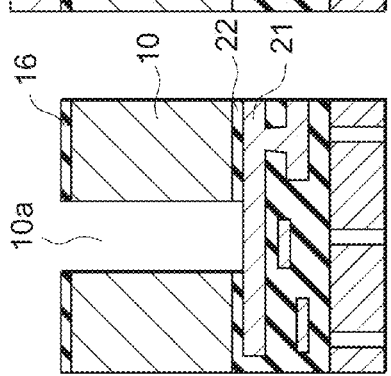
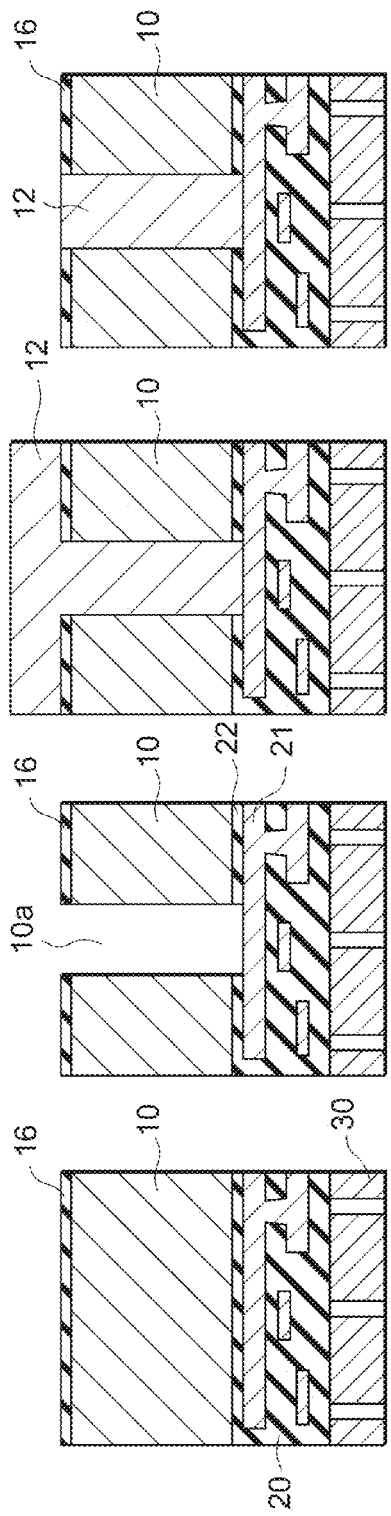
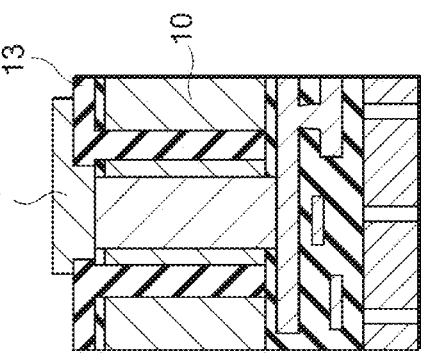
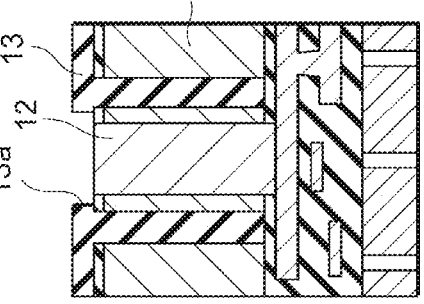
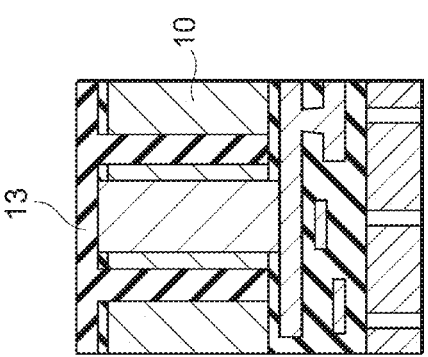
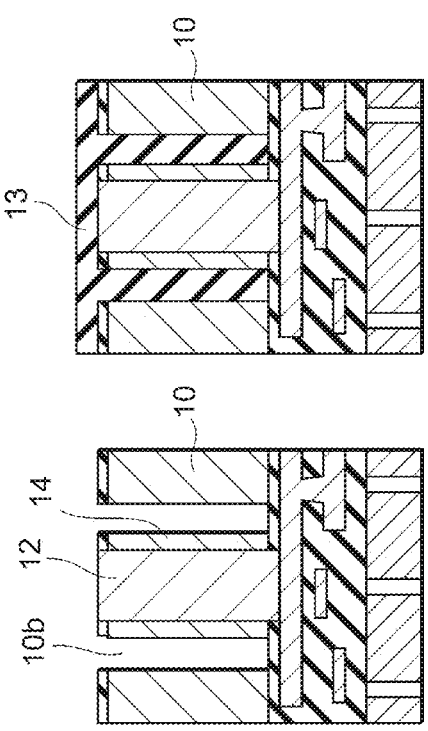

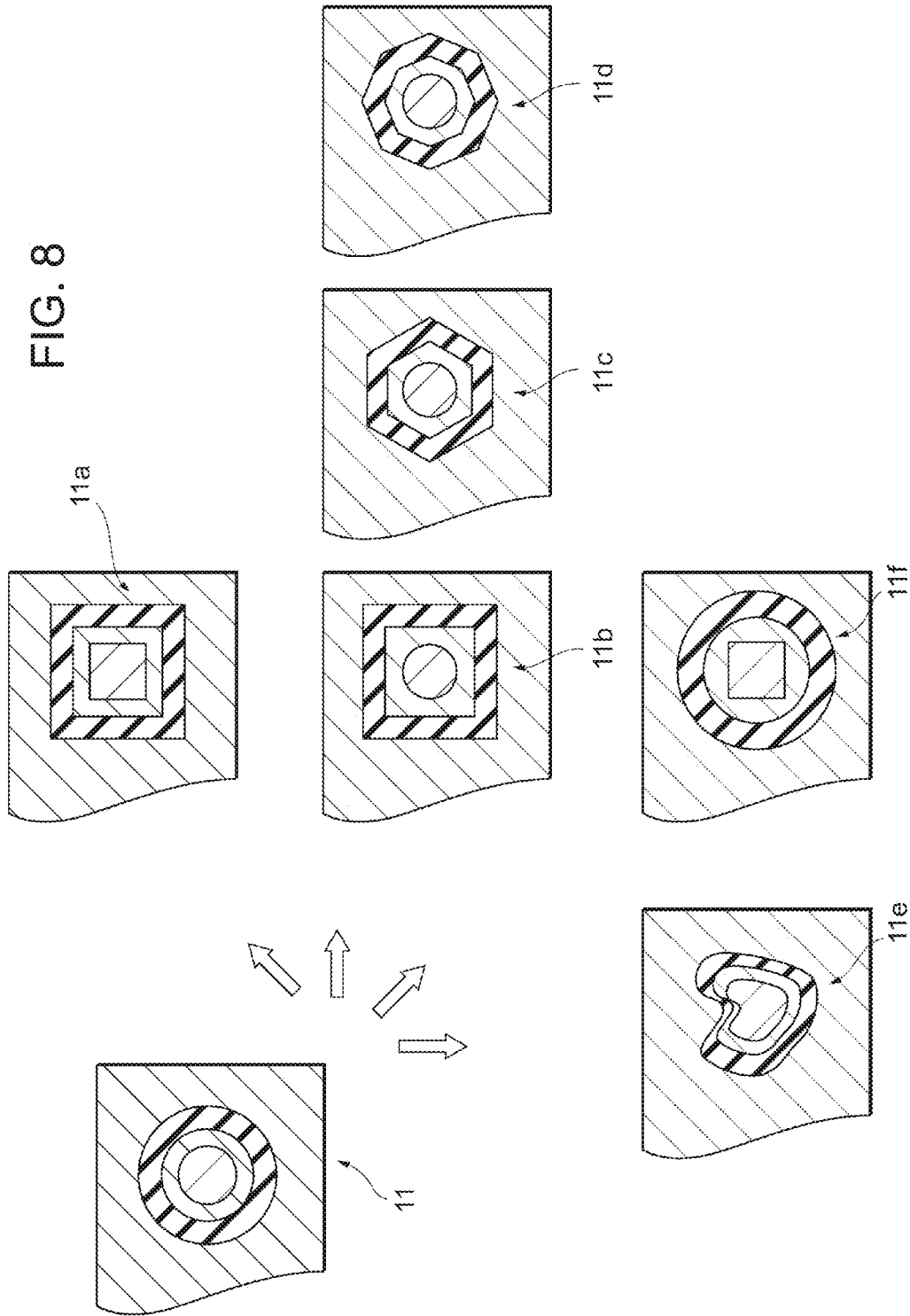

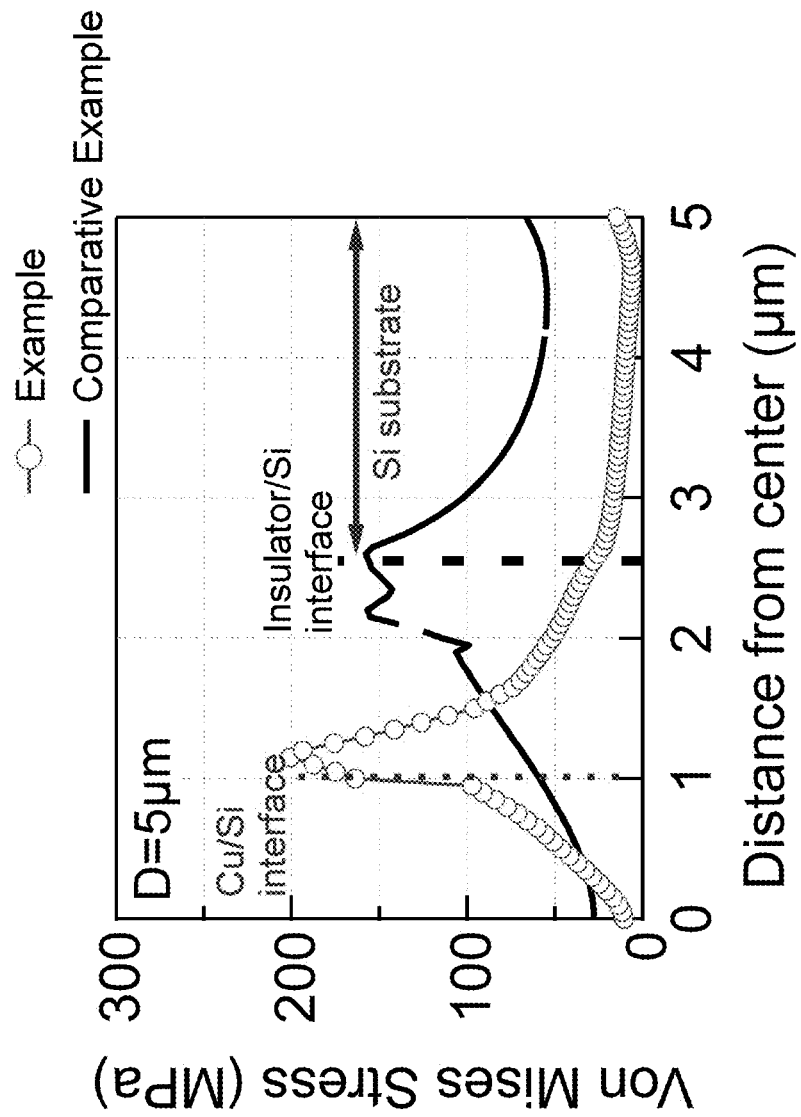

THROUGH ELECTRODE, MANUFACTURING METHOD THEREOF, AND SEMICONDUCTOR DEVICE AND MANUFACTURING METHOD THEREOF

CROSS-REFERENCE TO RELATED APPLICATIONS

This application claims the benefit under 35 U.S.C. §119 (a) of Japanese Patent Application No. 2016-002745, filed on Jan. 8, 2016, the entire disclosure of which is incorporated herein by reference in its entirety.

BACKGROUND OF THE INVENTION

Field of the Invention

The present disclosure relates to a through electrode used in a three-dimensional integrated circuit and a manufacturing method thereof, and a semiconductor device and a manufacturing method thereof.

Description of Related Art

Along with demands for more compact portable and wireless electronic devices, the development of finer and denser integrated circuits has been promoted to be used for micro-electronics in the next-generation. As a method to connect electronic devices mutually, three-dimensional packaging technology currently attracts attention. A through electrode, such as a through-silicon via (TSV), is one of the techniques to implement three-dimensional packaging, which is used to electrically connect devices that are three-dimensionally stacked, such as a logic, a memory, a sensor and an actuator.

Copper is a promising material for a conductive layer to make up a through electrode because of its low electric resistivity and high stress migration resistance. Meanwhile the use of a silicon oxide film as a side-wall insulating film has been examined so as to coat the side face of a conductive layer of a through electrode (see Non-Patent Document 1, for example). A conventional known method for manufacturing a through electrode includes: forming a through hole (contact hole) to penetrate through a semiconductor substrate; forming a side-wall insulating film to coat a side wall and a bottom part of the through hole; and removing the side-wall insulating film formed at the bottom part of the through hole by anisotropic etching, and then filling the through hole with metal, such as copper.

CITATION LIST

Non-Patent Document

[Non-Patent Document 1] S. E. Thompson, G. Sun, Y. S. Choi, and T. Nishida, "Uniaxial-process-induced strained-Si: extending the CMOS roadmap," IEEE Trans. Electron Devices, vol. 53, no. 5, pp. 1010-1020, May 2006.

SUMMARY OF THE INVENTION

Although anisotropic etching in the conventional method for manufacturing a through electrode as stated above is to remove the side-wall insulating film at the bottom part of the through hole only, such etching has a problem of etching the side-insulating film formed at the side wall of the through hole as well. If the side-wall insulating film left on the side wall of a through hole is not uniform in thickness, the film cannot keep the insulating property. Additionally when silicon oxide is used as a side-wall insulating film, high-temperature process is required to coat the side wall of a through hole. A through electrode subjected to such high-temperature process, however, has a problem of having large stress induced around the through electrode due to a large difference in thermal expansion rate between copper making up the through electrode and a semiconductor substrate, such as silicon.

In view of such a circumstance, the present disclosure is directed to provide a through electrode that can be manufactured by a method not including the step of removing a side-wall insulating film formed at the bottom part of the through hole and so having improved electrical characteristics and mechanical reliability and a manufacturing method thereof as well as a semiconductor device and a manufacturing method thereof.

To solve the above problems, a through electrode according to the present disclosure is disposed in a semiconductor substrate, and the through electrode includes: a conductive layer; a side-wall insulating film that is disposed between the conductive layer and the semiconductor substrate, the side-wall insulating film being represented by the following chemical formula (1), and a tubular semiconductor layer disposed between the conductive layer and the semiconductor substrate, the semiconductor layer including a same material as the material of the semiconductor substrate.

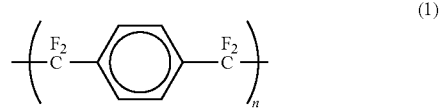

(1)

To solve the above problems, a method for manufacturing a through electrode according to the present disclosure includes: forming an opening at a position of a semiconductor substrate in which a side-wall insulating film is to be formed; filling the opening with an insulating material represented by the following chemical formula (1) so as to form the side-wall insulating film; forming a through hole inside of the side-wall insulating film; and filling the through hole with a conductive material to form a conductive layer.

To solve the above problems, a method for manufacturing a through electrode according to the present disclosure includes: forming a through hole in a semiconductor substrate; filling the through hole with a conductive material to form a conductive layer; forming an opening at a position of the semiconductor substrate in which a side-wall insulating film is to be formed; and filling the opening with an insulating material represented by the following chemical formula (1) so as to form the side-wall insulating film.

The present disclosure further relates to a method for manufacturing a semiconductor device, including the method for manufacturing a through electrode as stated above.

BRIEF DESCRIPTION OF THE DRAWINGS

FIGS. 3A to 3G are cross-sectional views illustrating the steps of a manufacturing method of a through electrode according to Embodiment 1.

FIGS. 4A to 4H are cross-sectional views illustrating the steps of a manufacturing method of a through electrode according to Embodiment 2.

FIGS. 6A to 6G are cross-sectional view illustrating the steps of a manufacturing method of a through electrode according to Embodiment 3.

FIGS. 7A to 7H are cross-sectional views illustrating the steps of a manufacturing method of a through electrode according to Embodiment 4.

FIG. 8 shows other examples of the layout of the through electrode.

FIG. 20 shows thermal stress around the conductive layer in Example corresponding to the third embodiment.

DETAILED DESCRIPTION

Figure 1:
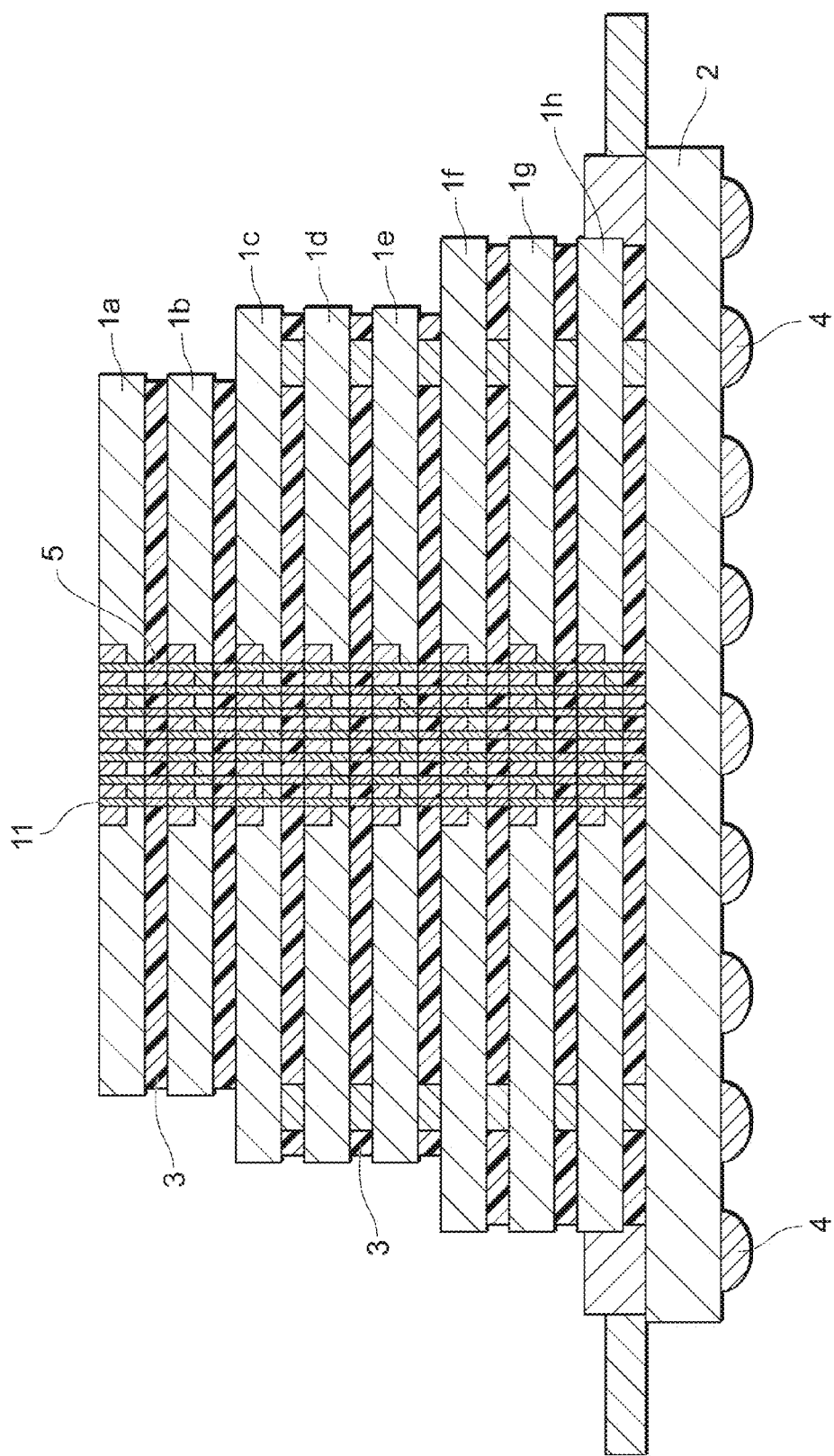
FIG. 1 is a cross-sectional view illustrating an exemplary schematic configuration of a three-dimensional stacked device, including a through electrode according to the present embodiment.

The following describes embodiments of the present disclosure in details. Referring now to the drawings, embodiments of the present disclosure are described below. In the drawings, the same reference numerals are assigned to the same elements, and their duplicated descriptions are omitted. The positional relationship, such as above, below, left and right, in the description is based on the positional relationship in the drawings, unless otherwise specified. The dimensions and proportions in the drawings are not limited to those illustrated in the drawings. The following embodiments are just illustration to explain the present disclosure, which is not intended to limit the present disclosure to them. Further, the present disclosure is susceptible to various modifications without deviating from the gist thereof.

FIG. 1 is a cross-sectional view illustrating an exemplary schematic configuration of a three-dimensional stacked device, including a through electrode according to the present embodiment. The three-dimensional stacked device includes a plurality of semiconductor chips (semiconductor devices) 1a to 1h that are stacked on an interposer 2. Between the semiconductor chips 1, encapsulation resin 3 is disposed. Hereinafter when there is no need to distinguish the semiconductor chips 1a to 1h, they are called simply a semiconductor chip 1. Each semiconductor chip 1a to 1h includes a logic, a memory, a sensor, an actuator and the like. Each semiconductor chip 1a to 1h includes a plurality of through electrodes 11 that penetrates through the chip, so that the vertically-disposed semiconductor chips 1a to 1h are electrically connected. Between the through electrode 11 of one semiconductor chip 1 and the through electrode 11 of another semiconductor chip 1, a bump 5 is formed to electrically and mechanically connect these electrodes. Bumps 4 are formed on the interposer 2 as well. Materials of the bumps 4, 5 are not limited especially, which may include Au, Cu, Ag, Ni or the like as well as a solder material, such as Sn—Ag—Cu, Sn—Bi, Au—Sn, or Sn—Pb.

In the example of FIG. 1, the through electrodes 11 are densely formed at a center part of these semiconductor chips 1 so as to form an array of the through electrodes 11, which is not a limiting example. The through electrodes 11 may be formed at the periphery of the semiconductor chips.

Embodiment 1

Figure 2A:
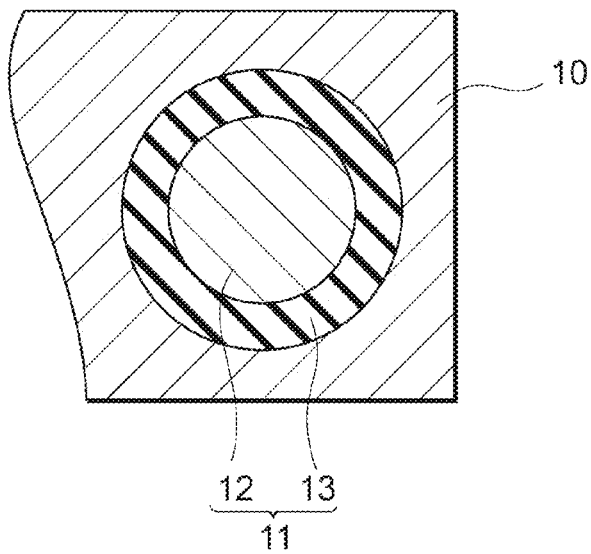
FIGS. 2A and 2B are cross-sectional views illustrating the configuration of a through electrode according to Embodiment 1.
Figure 2B:
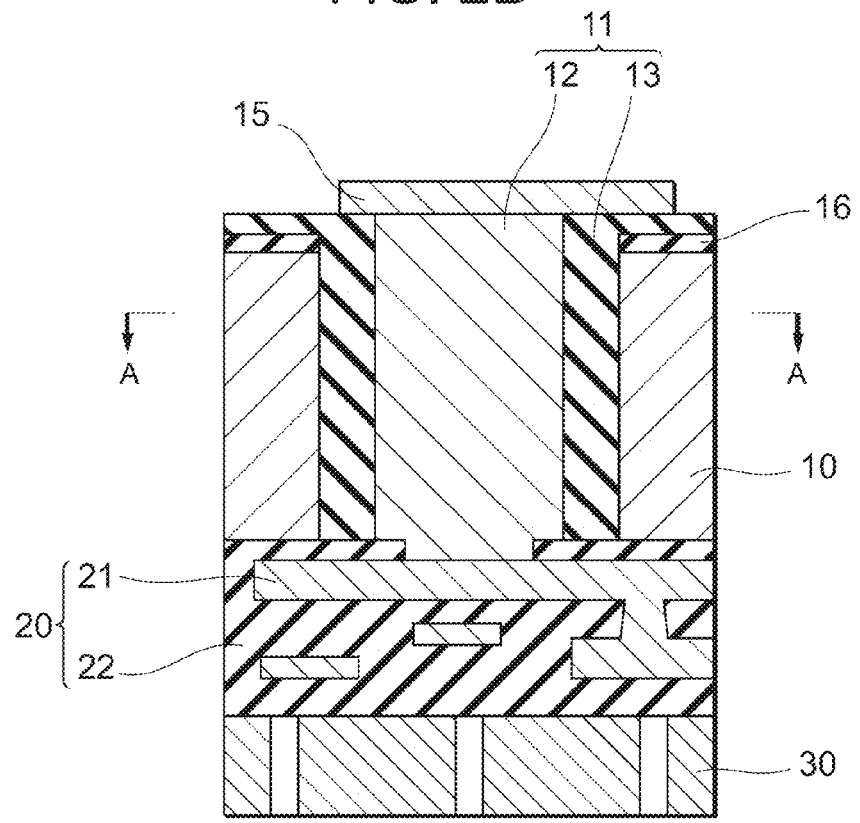

FIGS. 2A and 2B are cross-sectional views showing one example of the configuration of the through electrode 11 according to Embodiment 1 in details. FIG. 2B shows a cross section that is perpendicular to the principal surface of the semiconductor substrate, and FIG. 2A is a cross-sectional view taken along the line A-A of FIG. 2B. On one of the surfaces of the semiconductor substrate 10, a wiring layer 20 is formed, which includes a plurality of lines 21 and insulating layers 22, and the wiring layer 20 and the semiconductor substrate 10 are supported on a supporting substrate 30. The through electrode 11 is formed in the semiconductor substrate 10, and the through electrode 11 can be a through-silicon via (TSV) so as to reach the lines 21 in the wiring layer 20. The through electrode 11 includes a conductive layer 12 formed in the semiconductor substrate 10 and a side-wall insulating film 13 that is disposed between the conductive layer 12 and the semiconductor substrate 10 so as to be in contact with the conductive layer 12 and the semiconductor substrate 10. On the through electrode 11, a line 15 made of metal is disposed. For the side-wall insulating film 13, Parylene-HT (registered trademark) is used, which is represented by chemical formula (1).

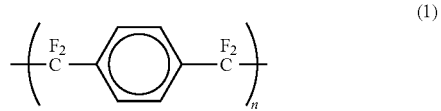

(1)

The semiconductor substrate 10 is a base material to form devices, such as a logic, a memory, a sensor and an actuator. The semiconductor substrate 10 is not limited to a Si substrate, which may be a semiconductor substrate made of GaAs, InP, SiC, GaN, CaTe or the like. The semiconductor substrate 10 may contain various impurities introduced.

The diameter of the through electrode 11 is not limited, which may be 2 μm to 25 μm, for example. The pitch of the through electrodes is not limited, which may be set at double or more the diameter, for example. The through electrodes 11, which are to exchange signals between the plurality of semiconductor chips 1, may be formed densely, and in this case, the diameter and the pitch of the through electrodes 11 tend to be small. When the through electrodes 11 are connected to a power supply, the diameter and the pitch of the through electrodes 11 tend to be large. The height of the through electrode 11 is not limited, which may be about 20 µm to 200 µm, for example. FIG. 2A shows an example of the layout of the through electrode 11 including circular, especially exact-circular conductive layer 12 and side-wall insulating film 13 in a cross section parallel to the principal surface of the semiconductor substrate 10, which is not a limiting example. For instance, one or both of the through electrode 11 and the side-wall insulating film 13 may have a multiangular shape or have a shape including a curve other than a circle.

The conductive layer 12 makes up a primary conductive layer of the through electrode 11, which is made of a metal material with small electric resistance, such as copper, tungsten, aluminum, polysilicon, and preferably copper. The thickness of the conductive layer 12 in the planar direction of the semiconductor substrate, i.e., the diameter of the conductive layer 12 is 0.5 µm to 20 µm, for example.

The side-wall insulating film 13 is to insulate the conductive layer 12 of the through electrode 11 from the semiconductor substrate 10, and Parylene-HT (registered trademark) represented by chemical formula (1) is used therefor. When the conductive layer 12 is made of copper, the Parylene-HT film serves as a barrier layer as well to prevent diffusion of copper from the conductive layer 12 to the semiconductor substrate 10. The thickness of the side-wall insulating film 13 in the planar direction of the semiconductor substrate is 0.3 µm to 2.0 µm, for example. Table 1 shows the characteristics of the Parylene-HT used for the side-wall insulating film 13.

TABLE 1

|  | Parylene-HT | Silicon oxide |
|---|---|---|
| Density (g/cm$^3$) | 1.32 | 2.2 |
| Young's modulus (GPa) | 2.55 | 69 |
| Melting point (° C.) | >500 | 1600 |
| Thermal expansion rate (ppm/° C.) | 36 | 0.5 |
| Dielectric constant | 2.17-2.21 | 3.9 |
| Resistivity (Ω · cm) | $2 \times 10^{17}$ | $1 \times 10^{14} \sim 1 \times 10^{16}$ |
| Coefficient of copper diffusion (cm$^2$/s) | $5.7 \times 10^{-18}$ (250° C.) $1.3 \times 10^{-16}$ (350° C.) | ~$1 \times 10^{-14}$ (250° C.) ~$1 \times 10^{-12}$ (350° C.) |

Since the through electrode 11 according to the present embodiment includes Parylene-HT as the side-wall insulating film 13 of the conductive layer 12, the following advantageous effects can be obtained.

For instance, even when the side-wall insulating film 13 is formed at low temperatures, e.g., at room temperature (25° C.), enough adhesiveness of the side-wall insulating film 13 to the semiconductor substrate 10 can be achieved. Since the side-wall insulating film 13 can be formed at room temperature, stress to the semiconductor substrate 10 resulting from the through electrode 11 can be suppressed.

Further, since Parylene-HT has lower Young's modulus than that of silicon oxide, such a film can function as a layer to release stress, and so the reliability of a semiconductor device formed in the semiconductor substrate can be improved.

Further, even when the Parylene-HT film is formed at low temperatures, e.g., at room temperature, a through hole can be coated uniformly without pin holes, and so such a film can be used to form a through electrode 11 having a high aspect ratio as well.

Further, since the Parylene-HT film has low dielectric constant, capacitive coupling can be reduced, and so signal delay and crosstalk between neighboring lines can be reduced.

Further, since the Parylene-HT film has a lower coefficient of copper diffusion than that of silicon oxide and can suppress leak current, a barrier layer is not required. Therefore, stress to the semiconductor substrate 10 due to thermal process to form a barrier layer can be suppressed. This also can reduce the number of manufacturing steps, and so lead to cost reduction as well.

As stated above, since the present embodiment includes Parylene-HT as the side-wall insulating film 13, the through electrode does not require a barrier layer and can have satisfactory mechanical reliability and electrical reliability.

Then, since a semiconductor device including the through electrode according to the present embodiment can solve the problem about thermo mechanical reliability relating to the formation of a through electrode, the reliability of the device can be improved. Since the through electrodes can be disposed densely, a semiconductor device that is useful for three-dimensional packaging can be provided.

Referring now to FIG. 3, the following describes one example of a method for manufacturing a through electrode according to the present embodiment. The present embodiment describes via-last scheme to form a semiconductor device in a semiconductor substrate, followed by the formation of a through electrode as one example, which may be via-after bonding scheme.

As illustrated in FIG. 3A, an element, such as a transistor not illustrated, is formed in a semiconductor substrate 10 made of silicon, for example, as well as a wiring layer 20 to form a circuit including the element such as a transistor. The wiring layer 20 includes lines 21 and an insulating layer 22. The semiconductor substrate 10 on the side of the wiring layer 20 is supported by a supporting substrate 30 via an adhesive layer (not illustrated), whereas the rear face side of the semiconductor substrate 10 without the wiring layer 20 is ground so as to make the semiconductor substrate 10 thinner. Subsequently, a hard mask 16 made of a permittivity material is formed on one of the surfaces of the semiconductor substrate 10. SiO$_2$ may be used for the dielectric material of the hard mask 16.

Next, as shown in FIG. 3B, a pattern is formed in the hard mask 16 by lithography and etching, the pattern having openings at which a side-wall insulating film is to be formed, and openings 10b are formed by etching using the hard mask 16 as the mask so as to penetrate through the semiconductor substrate 10. The etching of the semiconductor substrate 10 is performed using Bosch process, for example. In the Bosch process, an etching step of performing isotropic etching mainly using sulfur hexafluoride (SF$_6$) and a protection step of protecting the side wall using tetrafluoroethylene-based gas (such as C$_4$F$_8$) are repeated. Subsequently, for better adhesiveness of a Parylene-HT film to silicon, the inside of the openings 10b is washed. Washing includes 1) O$_2$ plasma treatment (power of a high-frequency power source: 700 W, the duration: 10 minutes), 2) immersion into sulfuric acid hydrogen peroxide mixture (110° C., 10 min.), 3) immersion into dilute hydrofluoric acid (25° C., 30 sec.), 4) washing with ultrapure water (10 min.), and 5) treatment with IPA (isopropyl alcohol).

Next, as illustrated in FIG. 3C, the openings 10b are filled with a Parylene-HT film so as to form the side-wall insulating film 13. The side-wall insulating film 13 is formed not only at the inside of the openings 10b but also on the semiconductor substrate 10. The Parylene-HT film is a polymer membrane. The Parylene-HT film is formed using dimer (di.poly.para-xylylene) in the powder form. For instance, dimer (di.poly.para-xylylene) is vaporized at 150° C. and with the pressure of 1.0 Torr, for example, to generate dimer gas, which is then thermal-decomposed at 680° C. and with the pressure of 0.5 Torr, for example, to be monomer gas. Then, this monomer gas is introduced to a semiconductor substrate placed in the room temperature atmosphere, specifically in the atmosphere at 25° C. and 0.1 Torr, so that poly (para-xylylene) as long-chain polymer is deposited on the semiconductor substrate 10. The principle of this deposition is that Parylene monomer becomes dense on the semiconductor substrate and is diffused, a chain of monomers starts to be formed and is propagated, and finally, long-chain polymer is formed. Due to agglomeration prior to polymerization, the side-wall insulating film 13 that is a transparent, conformal and pinhole-free coating is formed on the entire semiconductor substrate. The thickness of the side-wall insulating film 13 is 1 μm, for example. The width of the openings 10b is 0.3 to 2 μm, and the depth of the openings 10b is 20 μm or more, and so the openings 10b have a very high aspect ratio. Parylene-HT can fill the openings 10b having such a high aspect ratio.

Next, as shown in FIG. 3D, a pattern is formed in the side-wall insulating film 13 by lithography and etching, the pattern having an opening at which a through hole is to be formed, and a through hole 10a is formed by etching using the side-wall insulating film 13 as the mask so as to penetrate through the semiconductor substrate 10 and make the line 21 exposed. The etching of the semiconductor substrate 10 is performed using Bosch process, for example. In the Bosch process, an etching step of performing isotropic etching mainly using sulfur hexafluoride ($SF_6$) and a protection step of protecting the side wall using tetrafluoroethylene-based gas (such as $C_4F_8$) are repeated. Such etching enables etching of the semiconductor substrate 10 and the insulating layers 22 while having high etching selectivity for the side-wall insulating film 13 made of Parylene-HT. Subsequently, for better adhesiveness of copper to the side-wall insulating film 13 made of Parylene-HT, oxygen-plasma treatment is performed to reform the surface of the side-wall insulating film 13.

Next, as shown in FIG. 3E, the through hole 10a is filled with copper or solder to form the conductive layer 12. The conductive layer 12 is formed not only at the inside of the through hole 10a but also on the semiconductor substrate 10. When the through hole 10a is filled with copper, this conductive layer 12 can be formed by CVD, PVD, electroplating, electroless plating, or the like. When the through hole 10a is filled with solder, molten metal or metal paste may be vacuum injected, for example.

Next, as illustrated in FIG. 3F, the conductive layer 12 deposited on the semiconductor substrate 10 is removed by CMP. Thereby, a through electrode 11 including the conductive layer 12 and the side-wall insulating film 13 is formed in the through hole 10a.

Next, as shown in FIG. 3G, the line 15 is formed so as to connect to the through electrode 11.

As stated above, the through electrode 11 including the conductive layer 12 and the side-wall insulating film 13 and a semiconductor device including the through electrode are manufactured.

The method for manufacturing a through electrode of the present embodiment includes the process of forming the openings 10b to form the side-wall insulating film in addition to the process of forming the opening 10a. As a result, the method does not have process of isotropic etching of the side-wall insulating film at the bottom part of the through hole, and therefore a reliable through electrode can be manufactured. Although the openings 10b have a high aspect ratio, since Parylene-HT is used as the material of the side-wall insulating film, such openings 10b having a high aspect ratio can be filled with Parylene-HT.

According to the method for manufacturing a through electrode of the present embodiment, the side-wall insulating film 13 and the conductive layer 12 are formed at room temperature. Thereby, stress to the semiconductor substrate 10 can be suppressed, and so a through electrode having good thermo mechanical reliability can be manufactured.

According to the method for manufacturing a through electrode of the present embodiment, stress to the semiconductor substrate generated due to the formation of the through electrode can be suppressed because Parylene-HT is used as the side-wall insulating film 13. Thereby, a reliable semiconductor device can be manufactured, in which variation in device characteristics due to stress can be suppressed.

Embodiment 2

Although the conductive layer 12 is formed after the formation of the side-wall insulating film 13 in Embodiment 1, Embodiment 2 is configured to form the side-wall insulating film 13 after the formation of the conductive layer 12. Referring to FIG. 4, the following describes a method for manufacturing a through electrode according to Embodiment 2.

As shown in FIG. 4A, similarly to Embodiment 1, a hard mask 16 made of a permittivity material is formed on the semiconductor substrate 10 on the other side of the wiring layer 20.

Next, as shown in FIG. 4B, a pattern is formed in the hard mask 16 by lithography and etching, the pattern having an opening at which a through hole is to be formed, and a through hole 10a is formed by etching using the hard mask 16 as the mask so as to penetrate through the semiconductor substrate 10 and make the line 21 exposed. The etching of the semiconductor substrate 10 and the insulating layers 22 is performed using Bosch process, for example.

Next, as shown in FIG. 4C, the through hole 10a is filled with copper or solder to form the conductive layer 12. The conductive layer 12 is formed not only at the inside of the through hole 10a but also on the semiconductor substrate 10.

Next, as illustrated in FIG. 4D, the conductive layer 12 deposited on the semiconductor substrate 10 is removed by CMP.

Next, as shown in FIG. 4E, a pattern is formed in the hard mask 16 by lithography and etching, the pattern having openings at which a side-wall insulating film is to be formed, and openings 10b are formed by etching using the hard mask 16 as the mask so as to penetrate through the semiconductor substrate 10. The etching of the semiconductor substrate 10 is performed using Bosch process, for example. Subsequently, for better adhesiveness of a Parylene-HT film to silicon, the inside of the openings 10b is washed.

Next, as illustrated in FIG. 4F, the openings 10b are filled with a Parylene-HT film so as to form the side-wall insulating film 13. The side-wall insulating film 13 is formed not only at the inside of the openings 10b but also on the semiconductor substrate 10.

Next, as shown in FIG. 4G, an opening 13a is formed in the side-wall insulating film 13 deposited on the semiconductor substrate 10 by lithography and etching so as to make the conductive layer 12 exposed.

Next, as shown in FIG. 4H, the line 15 is formed so as to connect to the through electrode 11.

As stated above, the through electrode 11 including the conductive layer 12 and the side-wall insulating film 13 and a semiconductor device including the through electrode are manufactured.

According to the method for manufacturing of a through electrode of the present embodiment, similar advantageous effects to those of Embodiment 1 can be obtained.

Embodiment 3

Figure 5A:
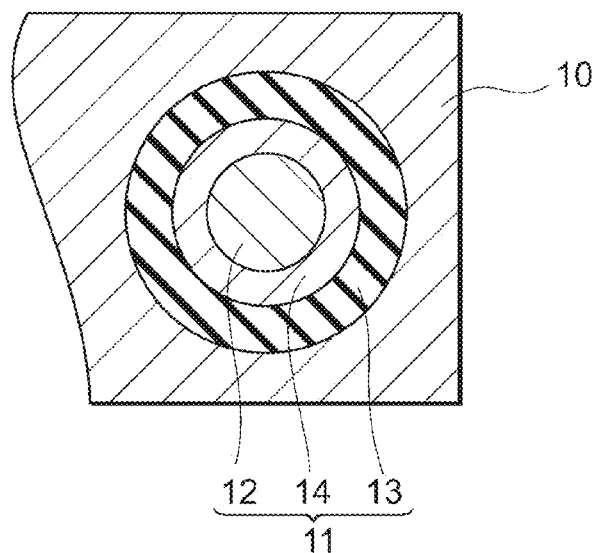
FIGS. 5A and 5B are cross-sectional views illustrating the configuration of a through electrode according to Embodiment 3.
Figure 5B:
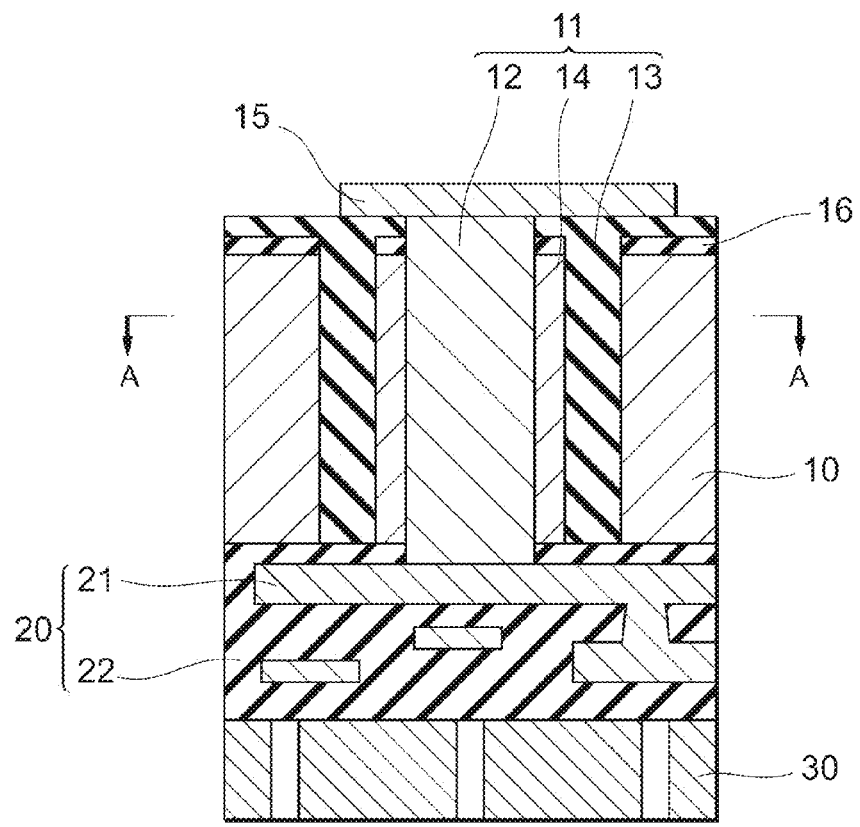

FIGS. 5A and 5B are cross-sectional views showing one example of the configuration of the through electrode 11 according to Embodiment 3 in details. FIG. 5B shows a cross section that is perpendicular to the principal surface of the semiconductor substrate, and FIG. 5A is a cross-sectional view taken along the line A-A of FIG. 5B. Unlike Embodiments 1 and 2, Embodiment 3 is configured to include a tubular semiconductor layer 14 between the conductive layer 12 and the side-wall insulating film 13, the semiconductor layer 14 being made of the same material as the semiconductor substrate 10, i.e., silicon. The through electrode 11 includes the conductive layer 12, the side-wall insulating film 13 and the semiconductor layer 14.

The through electrode according to the present embodiment includes the semiconductor layer 14 made of the same material as that of the semiconductor substrate, and therefore the interface between the conductive layer 12 and the semiconductor layer 14, i.e., the interface between the principal conductive material of the through electrode and the material of the semiconductor substrate can be located inside of the through electrode. As a result, even when the principal conductive material of the through electrode and the material of the semiconductor substrate have a large difference in thermal expansion rate, thermal stress due to the difference in thermal expansion rate can be kept inside of the through electrode, and therefore thermal stress acting on the edge of the through electrode or a region of the semiconductor substrate outside of the through electrode can be reduced. Thereby, variations in the characteristics of devices that are formed around the through electrode can be suppressed, and a keep-out-zone, i.e., the zone in which devices are forbidden, can be made smaller. As a result, the present embodiment can have a high-density array of the through electrodes. In this way, the through electrode of the present embodiment can solve the problem of thermo mechanical reliability due to the formation of the through electrode.

Since the problem of thermo mechanical reliability due to the formation of the through electrode can be solved, a semiconductor device including the through electrode according to the present embodiment can have improved reliability of the devices. Further, since the through electrodes can be disposed densely, a semiconductor device including these through electrodes can be useful for three-dimensional packaging.

Referring now to FIG. 6, the following describes one example of a method for manufacturing the through electrode according to the present embodiment. The present embodiment describes via-last scheme to form a semiconductor device in a semiconductor substrate, followed by the formation of a through electrode as one example, which may be via-after bonding scheme. The method for manufacturing a through electrode according to Embodiment 3 is configured so that the diameter of the through hole is smaller than that of the through hole 10a in Embodiment 1.

As shown in FIG. 6A, similarly to Embodiment 1, a hard mask 16 made of a permittivity material is formed on the semiconductor substrate 10 on the other side of the wiring layer 20.

Next, as shown in FIG. 6B, a pattern is formed in the hard mask 16 by lithography and etching, the pattern having openings at which a side-wall insulating film is to be formed, and openings 10b are formed by etching using the hard mask 16 as the mask so as to penetrate through the semiconductor substrate 10. The etching of the semiconductor substrate 10 is performed using Bosch process, for example. Subsequently, for better adhesiveness of a Parylene-HT film to silicon, the inside of the openings 10b is washed.

Next, as illustrated in FIG. 6C, similarly to Embodiment 1, the openings 10b are filled with a Parylene-HT film so as to form the side-wall insulating film 13. The side-wall insulating film 13 is formed not only at the inside of the openings 10b but also on the semiconductor substrate 10.

Next, as shown in FIG. 6D, a pattern is formed in the side-wall insulating film 13 by lithography and etching, the pattern having an opening at which a through hole is to be formed, and a through hole 10a is formed by etching using the side-wall insulating film 13 as the mask so as to penetrate through the semiconductor substrate 10 and make the line 21 exposed. During this step of forming the through hole 10a, the through hole is formed so as to leave a tubular semiconductor layer 14 as a part of the semiconductor substrate 10 between the side-wall insulating film 13 and the through hole 10a. To this end, the through hole 10a has a diameter smaller than that in Embodiment 1. The etching of the semiconductor substrate 10 and the insulating layers 22 is performed using Bosch process, for example.

Next, as shown in FIG. 6E, the through hole 10a is filled with copper or solder to form the conductive layer 12. The conductive layer 12 is formed not only at the inside of the through hole 10a but also on the semiconductor substrate 10. When the through hole 10a is filled with copper, this conductive layer 12 can be formed by CVD, PVD, electroplating, electroless plating, or the like. When the through hole 10a is filled with solder, molten metal or metal paste may be vacuum injected, for example.

Next, as illustrated in FIG. 6F, the conductive layer 12 deposited on the semiconductor substrate 10 is removed by CMP. Thereby, a through electrode 11 including the conductive layer 12, the side-wall insulating film 13 and the semiconductor layer 14 is formed.

Next, as shown in FIG. 6G, the line 15 is formed so as to connect to the through electrode 11.

As stated above, the through electrode 11 including the conductive layer 12, the side-wall insulating film 13, and the semiconductor layer 14 and a semiconductor device including the through electrode are manufactured.

According to the method for manufacturing a through electrode of the present embodiment, in addition to the advantageous effects of Embodiment 1, the through electrode 11 capable of optimizing thermal stress distribution by the semiconductor layer 14 can be formed easily.

Embodiment 4

Although the conductive layer 12 is formed after the formation of the side-wall insulating film 13 in Embodiment 3, Embodiment 4 is configured to form the side-wall insulating film 13 after the formation of the conductive layer 12. Referring to FIG. 7, the following describes a method for manufacturing a through electrode according to Embodiment 4.

As shown in FIG. 7A, similarly to Embodiment 1, a hard mask 16 made of a permittivity material is formed on the semiconductor substrate 10 on the other side of the wiring layer 20.

Next, as shown in FIG. 7B, a pattern is formed in the hard mask 16 by lithography and etching, the pattern having an opening at which a through hole is to be formed, and a through hole 10a is formed by etching using the hard mask 16 as the mask so as to penetrate through the semiconductor substrate 10 and make the line 21 exposed. The etching of the semiconductor substrate 10 and the insulating layers 22 is performed using Bosch process, for example.

Next, as shown in FIG. 7C, the through hole 10a is filled with copper or solder to form the conductive layer 12. The conductive layer 12 is formed not only at the inside of the through hole 10a but also on the semiconductor substrate 10.

Next, as illustrated in FIG. 7D, the conductive layer 12 deposited on the semiconductor substrate 10 is removed by CMP.

Next, as shown in FIG. 7E, a pattern is formed in the hard mask 16 by lithography and etching, the pattern having openings at which a side-wall insulating film is to be formed, and openings 10b are formed by etching using the hard mask 16 as the mask so as to penetrate through the semiconductor substrate 10. During this step of forming the through holes 10b, the through holes are formed so as to leave a tubular semiconductor layer 14 as a part of the semiconductor substrate 10 between the conductive layer 12 and the through holes 10b. To this end, at the step of FIG. 7B, the through hole 10a may have a diameter smaller than that in Embodiment 2. The etching of the semiconductor substrate 10 is performed using Bosch process, for example. Subsequently, for better adhesiveness of a Parylene-HT film to silicon, the inside of the openings 10b is washed.

Next, as illustrated in FIG. 7F, the openings 10b are filled with a Parylene-HT film so as to form the side-wall insulating film 13. The side-wall insulating film 13 is formed not only at the inside of the openings 10b but also on the semiconductor substrate 10.

Next, as shown in FIG. 7G, an opening 13a is formed in the side-wall insulating film 13 deposited on the semiconductor substrate 10 by lithography and etching so as to make the conductive layer 12 exposed.

Next, as shown in FIG. 7H, the line 15 is formed so as to connect to the through electrode 11.

As stated above, the through electrode 11 including the conductive layer 12, the side-wall insulating film 13, and the semiconductor layer 14 and a semiconductor device including the through electrode are manufactured.

According to the method for manufacturing of a through electrode of the present embodiment, similar advantageous effects to those of Embodiment 3 can be obtained.

Embodiments 3 and 4 show an example of the through electrode 11 including circular, especially exact-circular conductive layer 12, side-wall insulating film 13, and semiconductor layer 14 in a cross section parallel to the principal surface of the semiconductor substrate 10, which is not a limiting example. For instance, this may be through electrodes 11a to 11f as shown in FIG. 8. The through electrode 11a is an example including quadrangular conductive layer 12, side-wall insulating film 13 and semiconductor layer 14. The through electrode 11b is an example including a circular conductive layer 12 and quadrangular side-wall insulating film 13 and semiconductor layer 14. The through electrode 11c is an example including a circular conductive layer 12 and hexagonal side-wall insulating film 13 and semiconductor layer 14. The through electrode 11d is an example including a circular conductive layer 12 and octagonal side-wall insulating film 13 and semiconductor layer 14. The through electrode 11e is an example where the outer shapes of the conductive layer 12, the side-wall insulating film 13 and the semiconductor layer 14 are curbs, instead of rectangles. The through electrode 11f is an example of a quadrangular conductive layer 12 and circular side-wall insulating film 13 and semiconductor layer 14.

Figure 9:
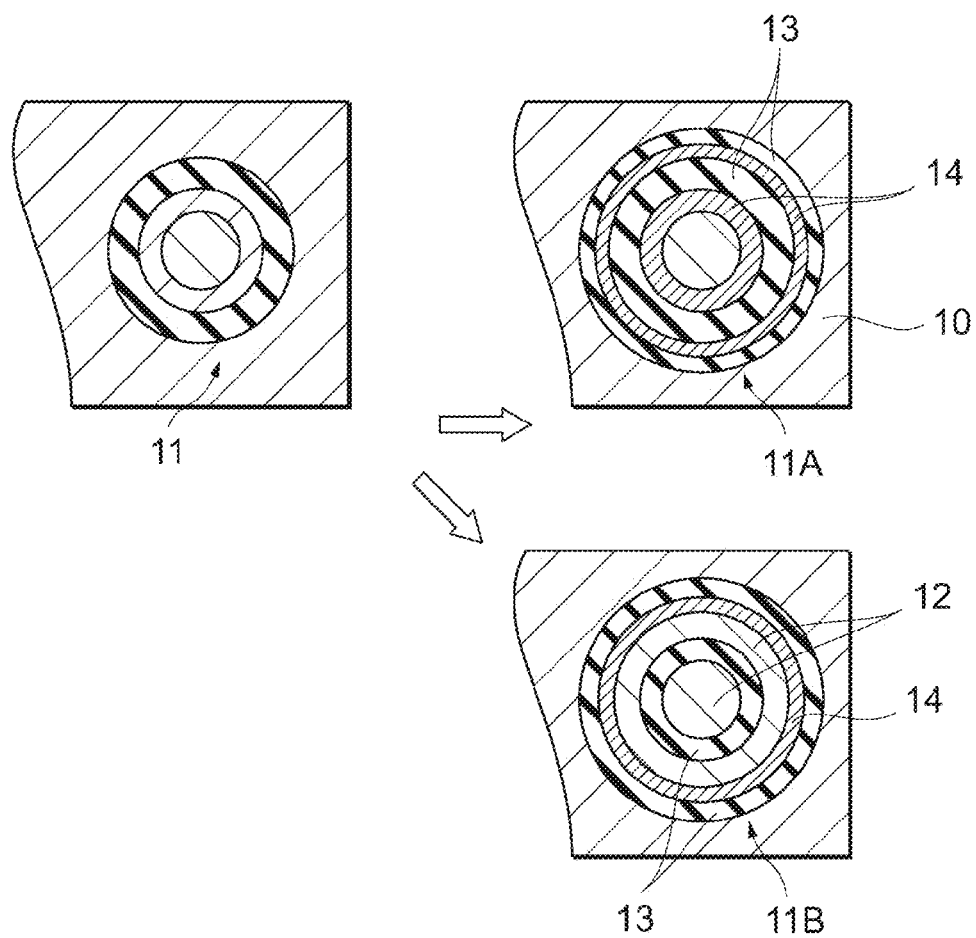
FIG. 9 shows other examples of the layout of the through electrode.

Embodiments 3 and 4 exemplify the through electrode 11 including one conductive layer 12, one side-wall insulating film 13 and one semiconductor layer 14, which is not a limiting example. For instance, this may be through electrodes 11A to 11B as shown in FIG. 9. The through electrode 11A is an example including two side-wall insulating films 13 and two semiconductor layers 14 that are arranged alternately and coaxially around the conductive layer 12. The through electrode 11B is an example including two conductive layers 12, two side-wall insulating films 13 and one semiconductor layer 14 that are arranged coaxially. As shown in FIG. 9, the configuration and the order of the conductive layer 12 as the center of the through electrode 11 and the semiconductor substrate 10 can be changed.

EXAMPLES

The following describes the advantageous effects of the through electrodes of the present embodiment, by way of the results of Examples.

Figure 10:
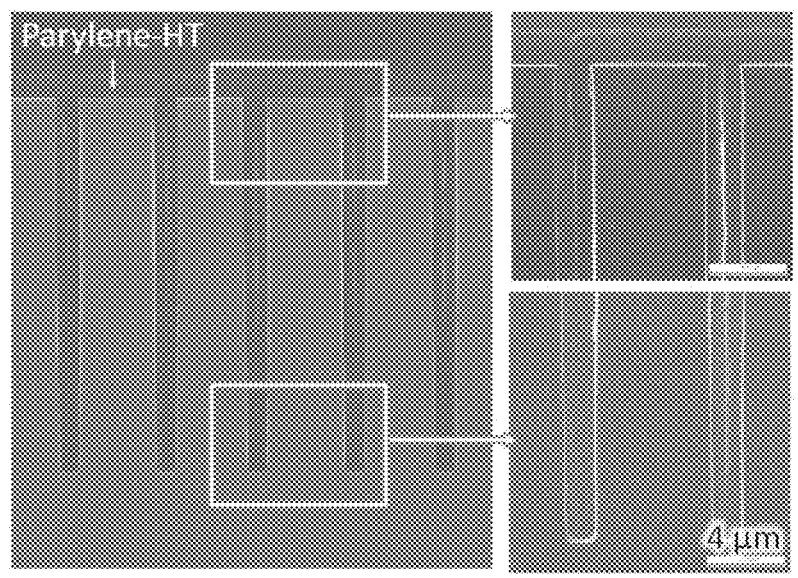
FIG. 10 is a cross-sectional scanning electron microscope (SEM) image of a semiconductor substrate after filling with a Parylene-HT film.
Figure 11:
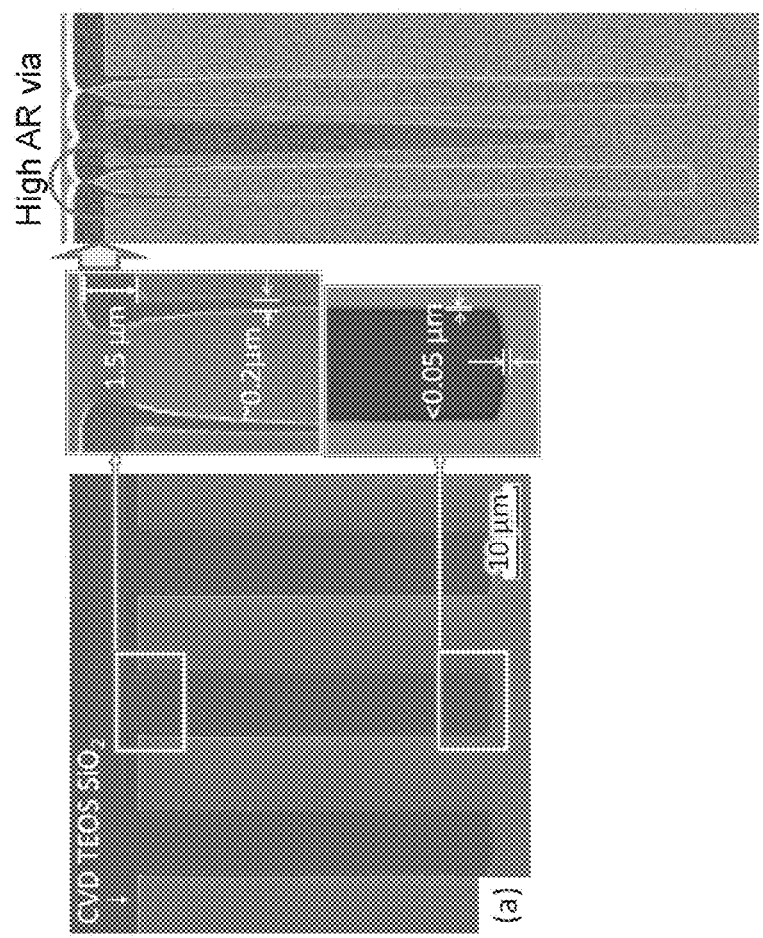
FIG. 11 is a cross-sectional SEM image of a semiconductor substrate after filling with a silicon oxide film.

FIG. 10 is a cross-sectional SEM image of the semiconductor substrate 10 after filling the openings 10b with Parylene-HT as the side-wall insulating film, the openings 10b having the width of 1.5 µm, the depth of 30 µm and the aspect ratio of 20. FIG. 11 is a cross-sectional SEM image of the semiconductor substrate 10 after filling the openings 10b of the same size as in FIG. 10 with silicon oxide (TEOS film) by CVD method as the side-wall insulating film. As shown in FIG. 10, a Parylene-HT film (side-wall insulating film) filled had no pinholes and was uniform in the openings 10b having a high aspect ratio. On the contrary, when silicon oxide was used as the side-wall insulating film 13, the filling of the openings 10b having a high aspect ratio failed, and the silicon oxide film on the left and right was connected at the upper part of the semiconductor substrate 10, and voids were generated inside. According to the method of the present embodiment, although the openings 10b had a high aspect ratio, such openings 10b were successfully filled with Parylene-HT as the side-wall insulating film 13 formed at low temperatures, e.g., at room temperature without pinholes. In this way, the method can be used for filling of the openings 10b having a high aspect ratio as well.

Figure 12:
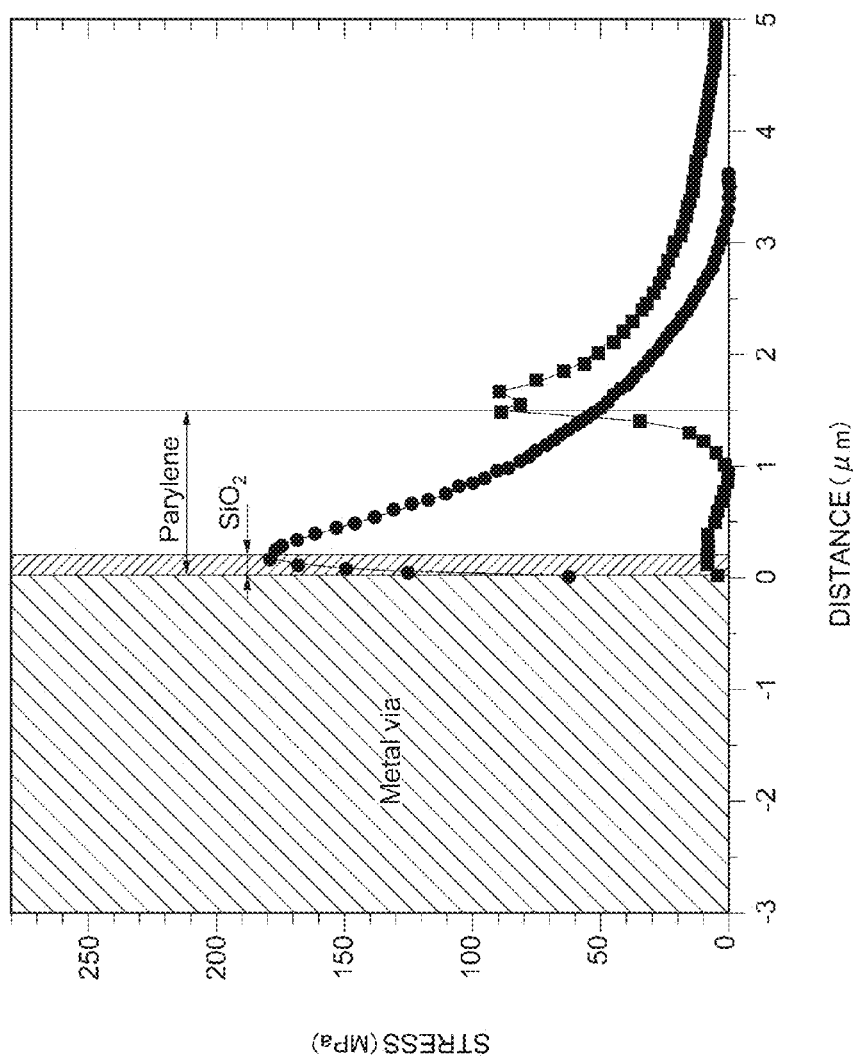
FIG. 12 shows thermal stress around the conductive layer in Example and Comparative Example.

FIG. 12 shows around the conductive layer 12 at 125° C. in Example and Comparative Example. The result shown in FIG. 12 was obtained by FEM (Finite Element Method). This FEM is a method typically used for analysis of the stress and reliability of through electrodes. Example was a through electrode including a side-wall insulating film 13 that was a Parylene-HT film of 1.5 µm around a conductive layer 12 made of solder. Comparative Example was a through electrode including a side-wall insulating film 13 that was a silicon oxide film of 0.2 µm around a conductive layer 12 made of copper.

As shown in FIG. 12, the configuration of Example shows about a half of the stress around the conductive layer 12 as compared with the configuration of Comparative Example. In this way, when Parylene-HT is used as the side-wall insulating film 13, such a side-wall insulating film 13 can absorb stress around the conductive layer 12, whereby thermo mechanical reliability of the through electrode 11 can be improved.

Figure 13:
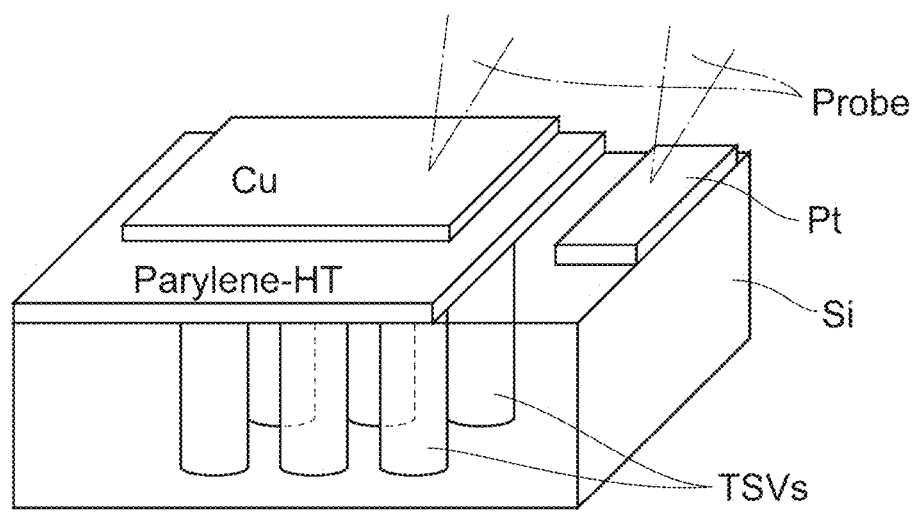
FIG. 13 shows a method of measuring the leak current and the capacitance of the Parylene-HT film in the through electrode.

FIG. 13 shows a method of measuring the leak current and the capacitance of the side-wall insulating film 13 in the through electrode 11. As shown in FIG. 13, a plurality of through electrodes (through silicon vias (TSVs)) was formed on a semiconductor substrate (Si) made of silicon. The plurality of through electrodes was formed because small capacitance and leak current were obtained from just one through electrode, which was beyond the measurement limit. The plurality of through electrodes was connected in parallel. A copper layer was formed on the semiconductor substrate 10 with the plurality of through electrode formed thereon via a Parylene-HT film. On another region of the semiconductor substrate 10, a platinum layer (Pt) of 200 nm in thickness was formed. Probes were brought into contact with the copper layer and the platinum layer, and current flowing between the probes was measured. In this way, the capacitance and the leak current of the through electrodes were measured.

Figure 14:
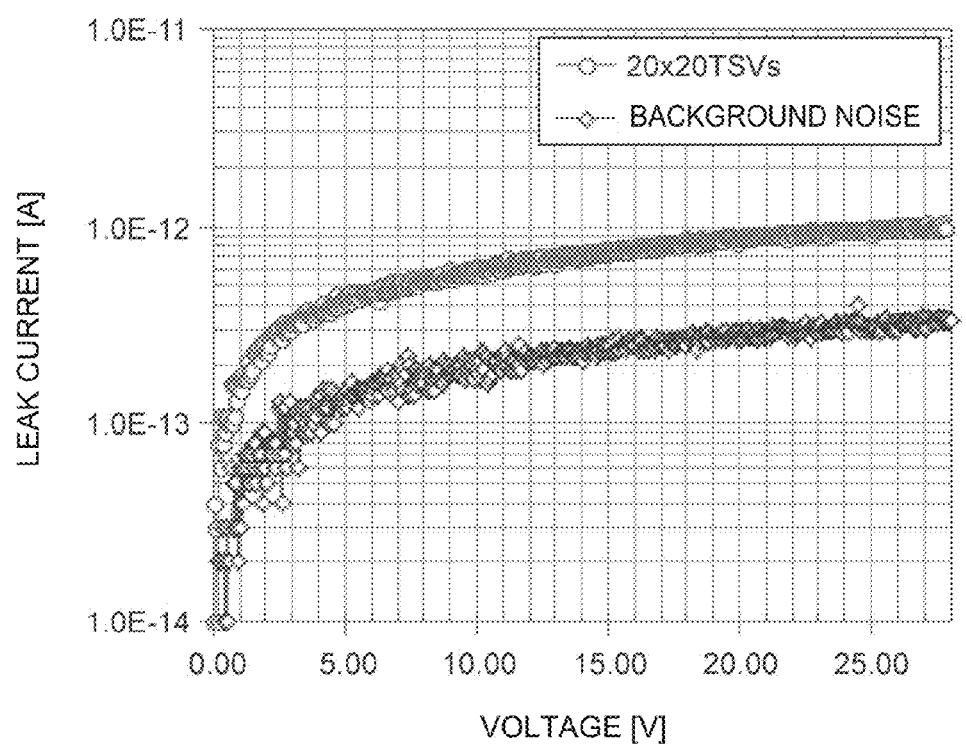
FIG. 14 shows a measurement result of the leak current from the Parylene-HT film in the array of the through electrodes.

FIG. 14 shows a measurement result of the leak current from the Parylene-HT film in the array of the through electrodes that was measured by the test method shown in FIG. 13. The leak current was measured using the array of through electrodes arranged 20×20, i.e., 400 through electrodes in total via the Parylene-HT film. As shown in FIG. 14, the leak current from the 400 through electrodes was a very small value of $1\times10^{-12}$ A at the voltage of 0 to 25 V. This result shows that the Parylene-HT film has excellent insulating property.

Figure 15:
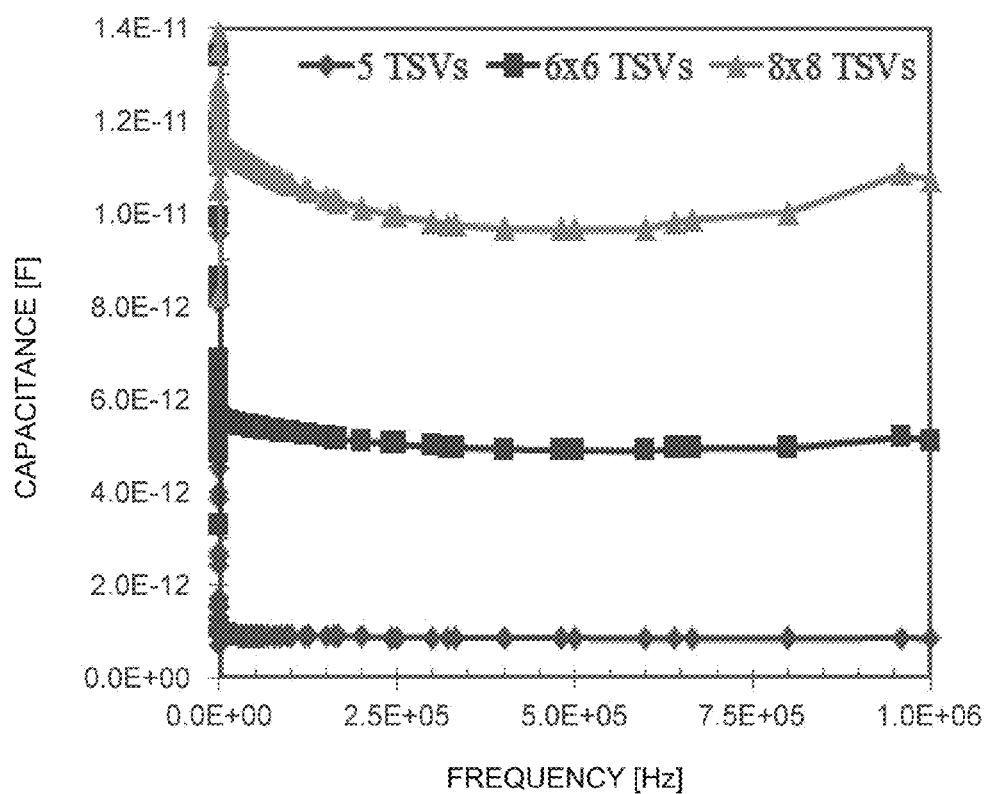
FIG. 15 shows a measurement result of frequencies versus capacitance of the Parylene-HT film in the array of the through electrodes.
Figure 16:
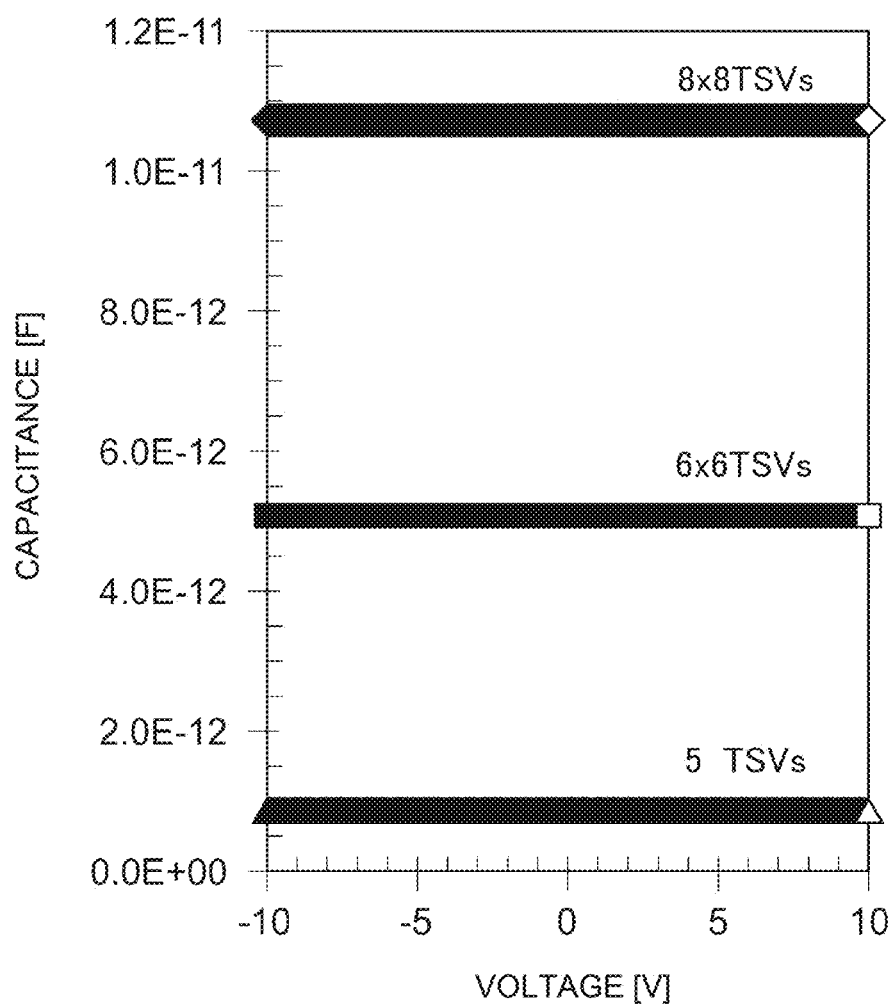
FIG. 16 shows a measurement result of voltage versus capacitance of the Parylene-HT film in the array of the through electrodes.

FIGS. 15 and 16 show a measurement result of the capacitance of a Parylene-HT film included in different arrays of through electrodes, which was measured by the test method shown in FIG. 13. In the measurement, the capacitance of the Parylene-HT films included in five through electrodes, in the array of 6×6 (36 in total) through electrodes, and in the array of 8×8 (64 in total) through electrodes was measured. The capacitance was measured while changing the frequency and the voltage. FIG. 15 shows a measurement result of the capacitance versus frequencies, and FIG. 16 shows a measurement result of the capacitance versus voltages. As shown in FIG. 16, the capacitance of the Parylene-HT film does not depend on voltage.

Figure 17:
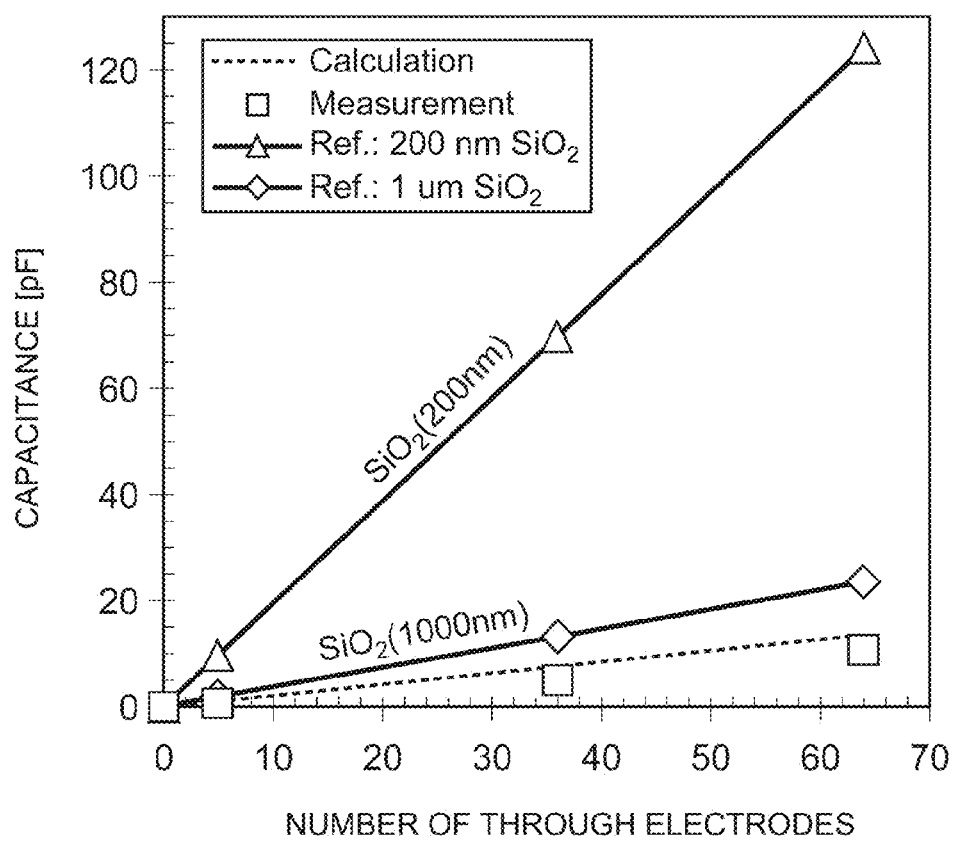
FIG. 17 shows the capacitance of the Parylene-HT film when the number of the through electrodes was changed.

FIG. 17 shows the capacitance of the Parylene-HT film when the number of the through electrodes was changed, which was measured by the test method shown in FIG. 13. In FIG. 17, "Measurement" shows the capacitance of the Parylene-HT film that was measured, and "Calculation" shows a calculated value of the capacitance of the Parylene-HT film. FIG. 17 also shows the capacitance of silicon oxide films of 200 nm and 1000 nm in thickness that was measured in the same condition. As shown in FIG. 17, the measurements of the capacitance of the Parylene-HT film follow the calculated values well. It is further shown that the capacitance of the Parylene-HT film is very lower than that of the silicon oxide films. A difference in capacitance between the Parylene-HT film and the silicon oxide film becomes more conspicuous with an increase in the number of the through electrodes. This shows that a Parylene-HT film used as the insulating film of the through electrodes can decrease capacitive coupling, and can reduce signal delay, power consumption and crosstalk between neighboring lines.

Figure 18:
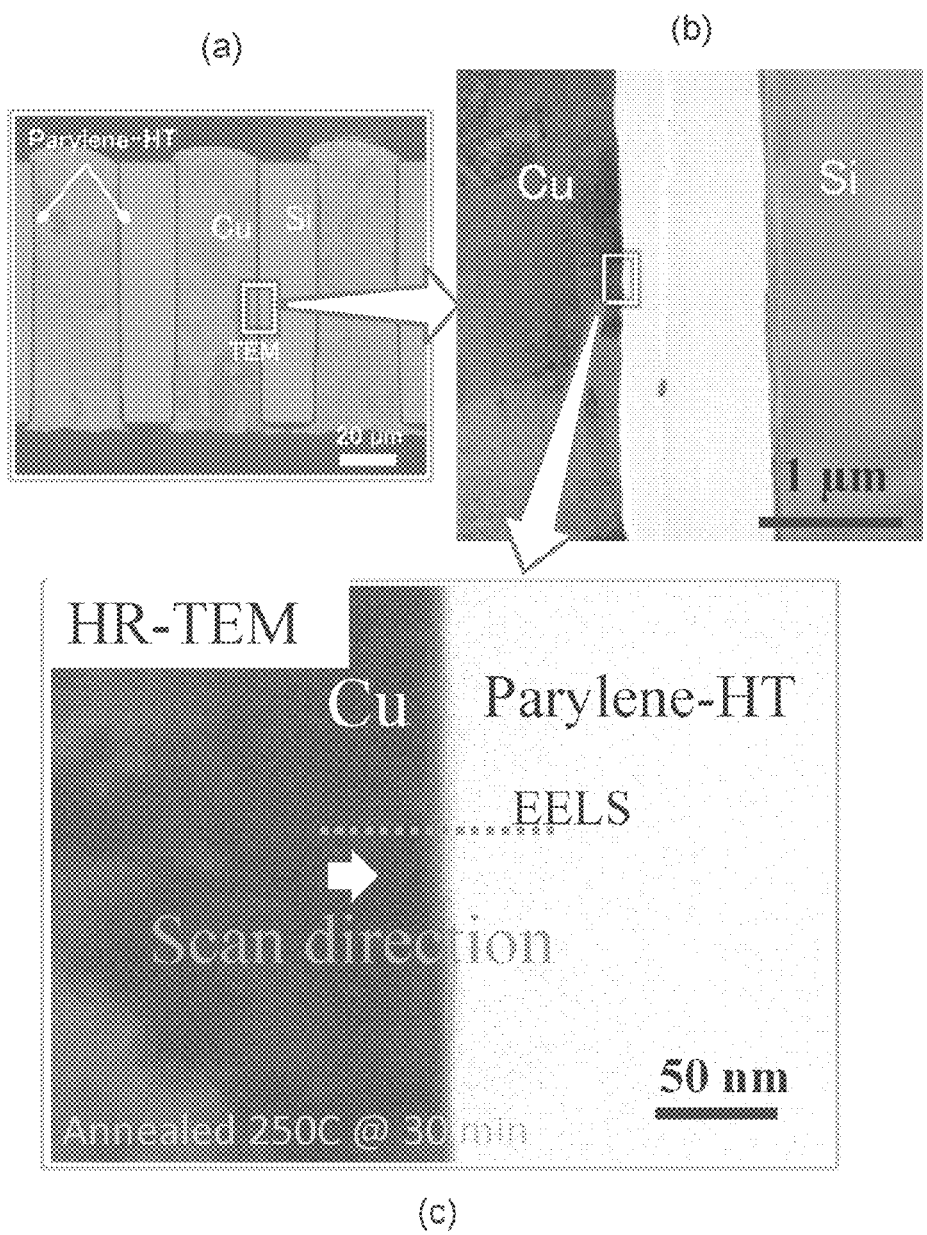
FIG. 18 is a high-definition transmission electron microscope (TEM) image showing the interface between the copper layer and the Parylene-HT film.
Figure 19:
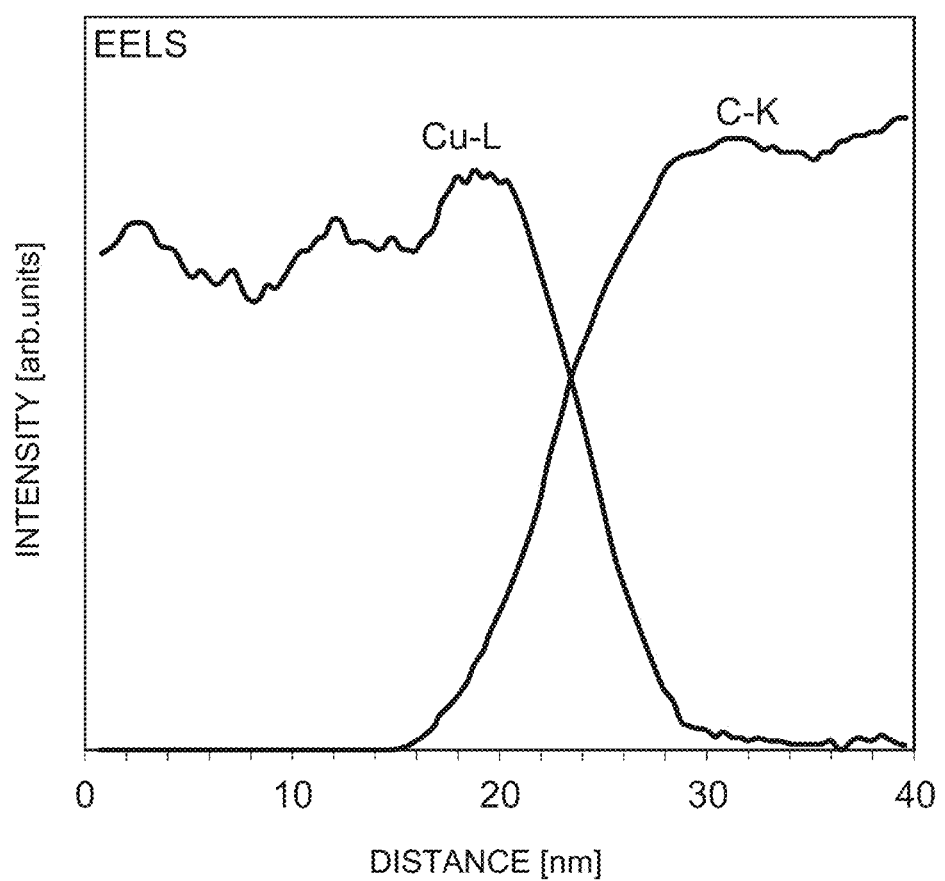
FIG. 19 shows a result of EELS measurement at the interface between the copper layer and the Parylene-HT film.

FIG. 18 is a high-definition TEM image showing the interface between the copper layer and the Parylene-HT film. FIG. 18(*a*) shows the overall image, FIG. 18(*b*) is an enlarged image of a part of FIG. 18(*a*), and FIG. 18(*c*) is an enlarged image of a part of FIG. 18(*b*). FIG. 19 shows a result of EELS measurement at the interface between the copper layer and the Parylene-HT film shown in FIG. 18(*c*). The EELS measurement was performed after annealing of the through electrodes shown in FIG. 18 at 250° C. for 30 minutes.

FIG. 19 shows that the region showing high intensity of Cu detected was the region of the copper layer, and the region showing high intensity of C detected was the region of the Parylene-HT film. As shown in FIG. 19, copper was diffused into the Parylene-HT film at the depth of 10 nm or less. This shows that the Parylene-HT film has a barrier function of copper, and so another barrier layer is not required.

FIG. 20 shows thermal stress (von Mises stress) around the conductive layer 12 in Example corresponding to Embodiment 3. Similar to FIG. 12, the result shown in FIG. 20 was obtained by FEM (Finite Element Method). Example shown in FIG. 20 was a through electrode 11 formed on a semiconductor substrate 10 made of silicon, the through electrode 11 comprising a conductive layer 12 made of copper with a diameter of 5 μm, a semiconductor layer 14 made of silicon with a thickness of 0.5 μm, and a side-wall insulating film 13 made of a Parylene-HT film with a thickness of 1 μm. Comparative Example was a through electrode with a configuration the same as that of the Example except that it did not include the semiconductor layer 14.

In FIG. 20, "Cu/Si interface" shows the interface between Cu of the conductive layer 12 and Si of the semiconductor layer 14, and the "insulator/Si interface" shows the interface between the side-wall insulating film 13 and Si of the semiconductor substrate 10, corresponding to the edge of the through electrode 11. The inner side of the "insulator/Si interface" corresponds to the inside of the through electrode 11.

As shown in FIG. 20, in the configuration of Example, although the stress was concentrated on the Cu/Si interface, which is inside of the through electrode, the stress at the region outside of the semiconductor layer 13 was reduced. On the other hand, in the configuration of Comparative Example, the stress was concentrated on the edge of the through electrode 11. The configuration of Example shows stress lower than 30 MPa at the edge of the through electrode 11, and this corresponds to an 80% decrease in stress compared to that of the configuration of Comparative Example.

In this way, in the configuration of Example corresponding to Embodiment 3, the thermal stress can be kept inside of the through electrode 11, and thermal stress acting on the edge of the through electrode 11 or a region of the semiconductor substrate outside of the through electrode 11 can be reduced. Thereby, variations in the characteristics of devices that are formed around the through electrode 11 can be suppressed, and the keep-out-zone can be made smaller. As a result, Example can have a high-density array of the through electrodes.

As stated above, the present disclosure is susceptible to various modifications without deviating from the gist thereof. The through electrodes as the above Example were described to explain the advantageous effects of the present embodiment, and the present embodiment is not limited to specific conditions (materials and film thicknesses) to manufacture the through electrodes of the above Example.

What is claimed is:

1. A through electrode disposed in a semiconductor substrate, comprising:
    a conductive layer;
    a side-wall insulating film that is disposed between the conductive layer and the semiconductor substrate, the side-wall insulating film being represented by the following chemical formula (1), and
    a tubular semiconductor layer disposed between the conductive layer and the semiconductor substrate, the tubular semiconductor layer including a same material as a material of the semiconductor substrate

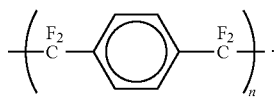
 (1)

2. The through electrode according to claim 1, wherein the conductive layer comprises copper or solder.

3. The through electrode according to claim 1, wherein the semiconductor substrate and the tubular semiconductor layer comprise silicon.

4. A semiconductor device comprising the through electrode according to claim 1.

* * * * *